United States Patent [19]

Mikami et al.

[11] Patent Number: 5,688,617
[45] Date of Patent: Nov. 18, 1997

[54] PHASE SHIFT LAYER-CONTAINING PHOTOMASK, AND ITS PRODUCTION AND CORRECTION

[75] Inventors: Koichi Mikami; Hiroyuki Miyashita; Yoichi Takahashi; Hiroshi Fujita; Masa-aki Kurihara, all of Tokyo, Japan

[73] Assignee: Dai Nippon Printing Co., Ltd., Tokyo, Japan

[21] Appl. No.: 644,856

[22] Filed: May 9, 1996

Related U.S. Application Data

[62] Division of Ser. No. 337,136, Nov. 10, 1994, Pat. No. 5,614,336, which is a continuation of Ser. No. 763,459, Sep. 20, 1991, abandoned.

[30] Foreign Application Priority Data

| Sep. 21, 1990 | [JP] | Japan | 2-253717 |
| Sep. 21, 1990 | [JP] | Japan | 2-253718 |
| Dec. 27, 1990 | [JP] | Japan | 2-407929 |
| Feb. 28, 1991 | [JP] | Japan | 3-33891 |
| Mar. 13, 1991 | [JP] | Japan | 3-47850 |

[51] Int. Cl.[6] .................................................. G03F 9/00
[52] U.S. Cl. ................... 430/5; 430/322; 430/324; 430/330; 204/192.37
[58] Field of Search ........................ 430/5, 296, 322, 430/324, 330; 204/192.32, 192.37

[56] References Cited

U.S. PATENT DOCUMENTS

| 4,873,163 | 10/1989 | Watakabe et al. | 430/5 |
| 5,032,491 | 7/1991 | Okumura et al. | 430/314 |
| 5,085,957 | 2/1992 | Hosono | 430/5 |
| 5,100,503 | 3/1992 | Allman et al. | 156/643 |

FOREIGN PATENT DOCUMENTS

| 0 383 534 | 8/1990 | European Pat. Off. . |
| 0 395 425 | 10/1990 | European Pat. Off. . |

*Primary Examiner*—S. Rosasco
*Attorney, Agent, or Firm*—Dellett and Walters

[57] ABSTRACT

The present invention relates particularly to a process for producing phase shift layer-containing photomasks, which can produce phase shift photomasks through a reduced or limited number of steps to reduce or limit the incidence of phase shifter pattern deficiencies or other defects and at lower costs as well.

For instance, a photomask blank of the structure that a substrate is provided thereon with an electrically conductive layer and a light-shielding thin film in this order is used to coat a starting material for spin-on-glass uniformly on a light-shielding pattern formed thereon. A pattern is directly drawn on the coaxed-spin-on-glass layer with energy beams emanating from electron beam exposure hardware, etc., and the substrate is developed with a solvent after pattern drawing with energy beams to wash off an excessive spin-on-glass portion other than the spin-on-glass layer irradiated with the ionizing radiations. Finally, the post-development substrate is baked to form a phase shifter pattern.

3 Claims, 15 Drawing Sheets

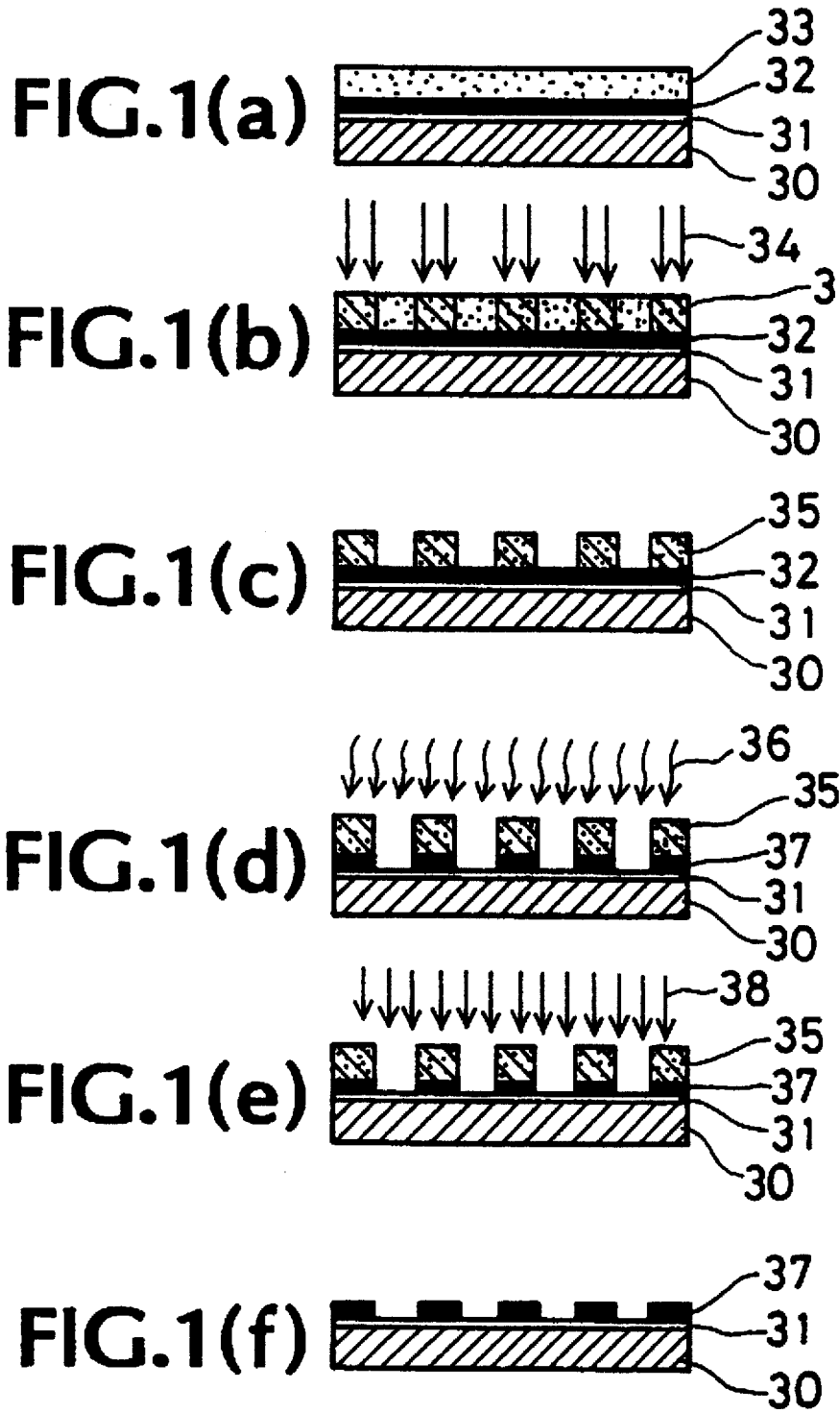

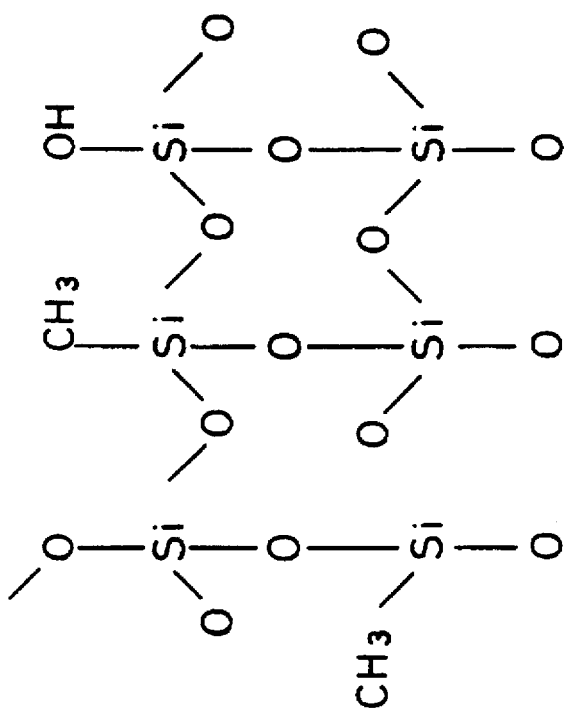
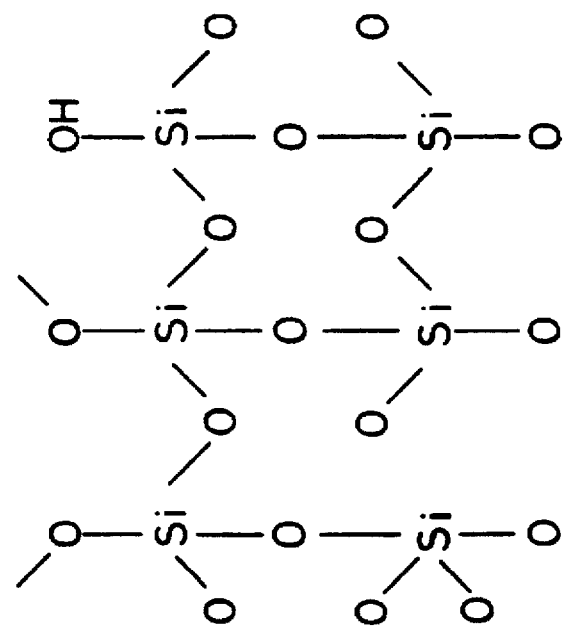
FIG. 4

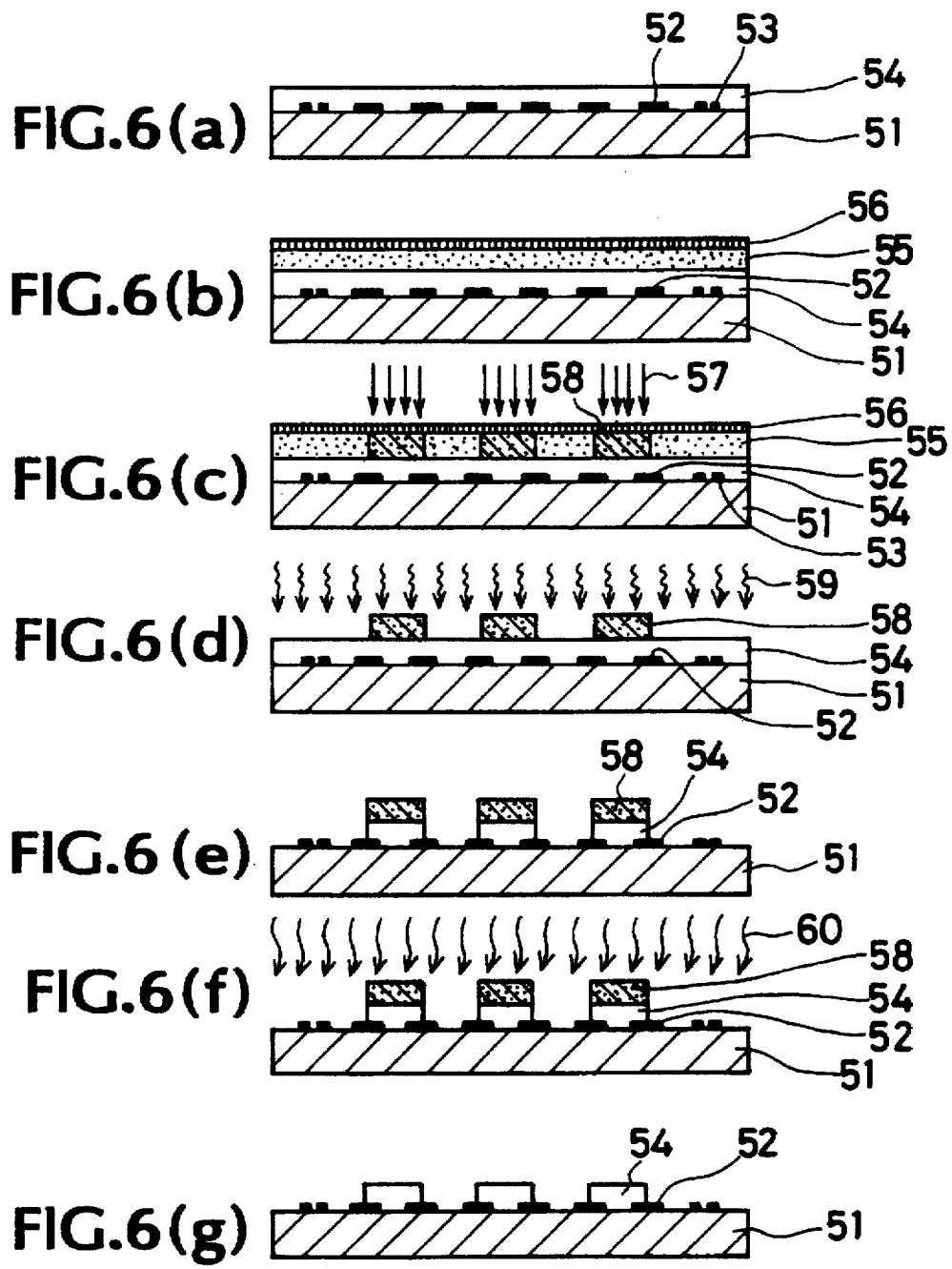
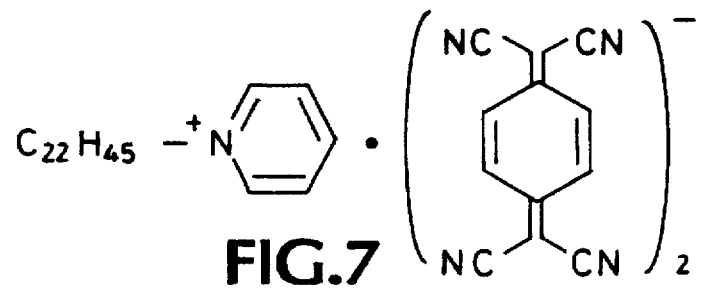
FIG.7

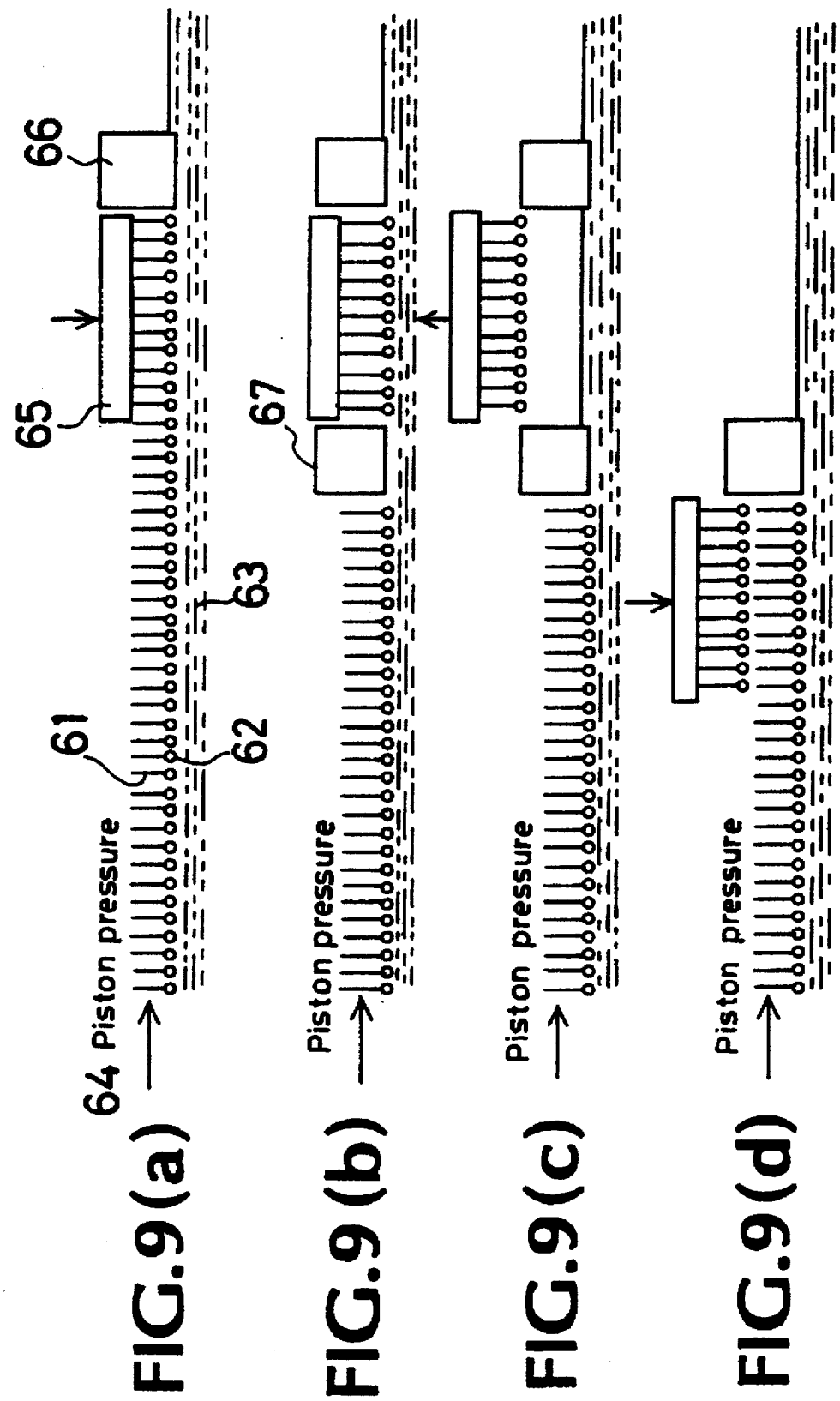

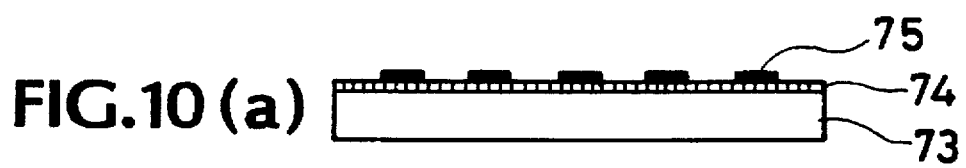
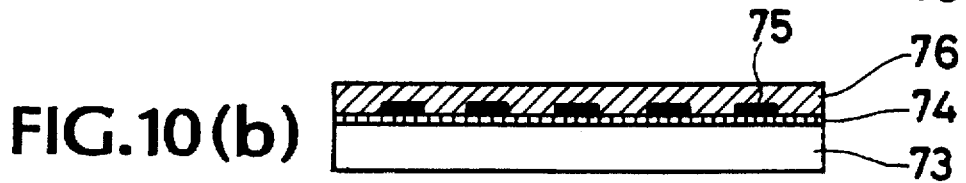
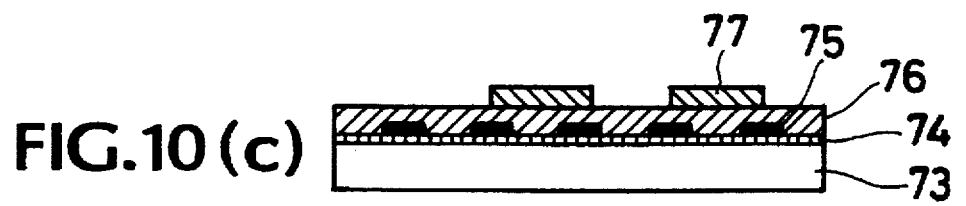
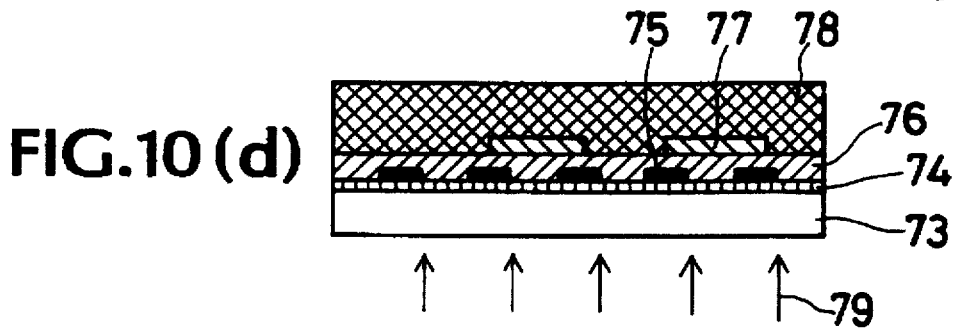
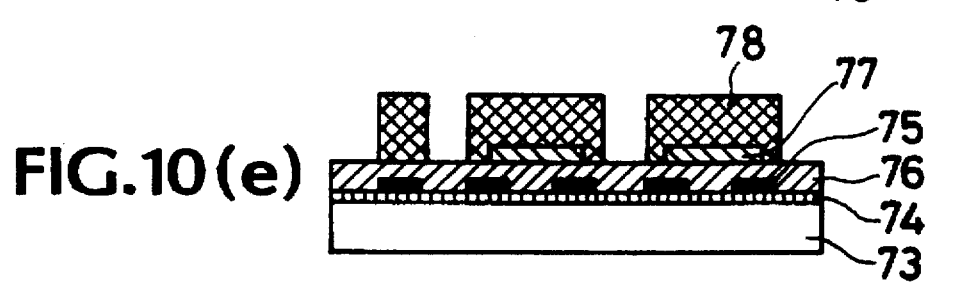
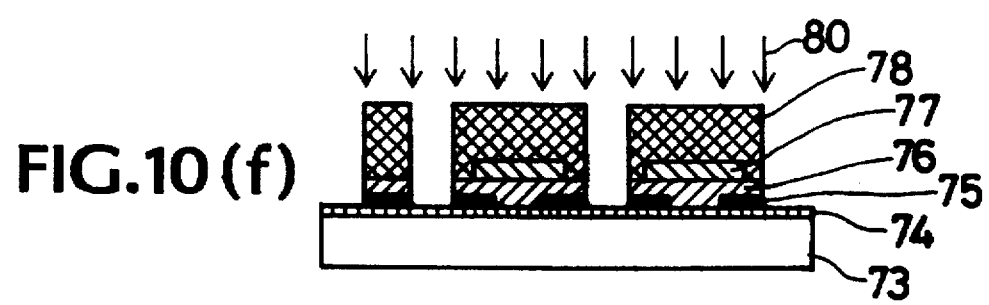
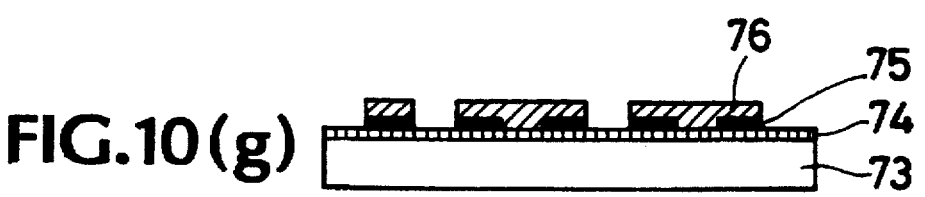

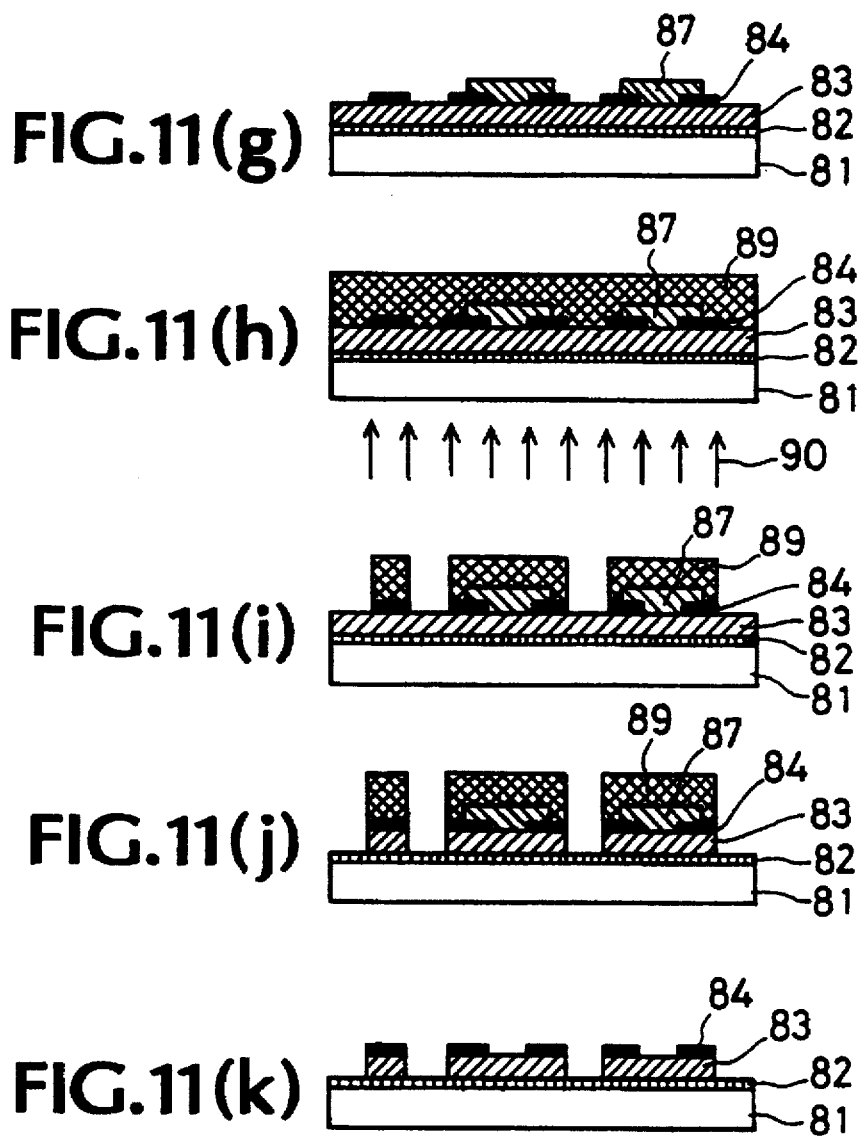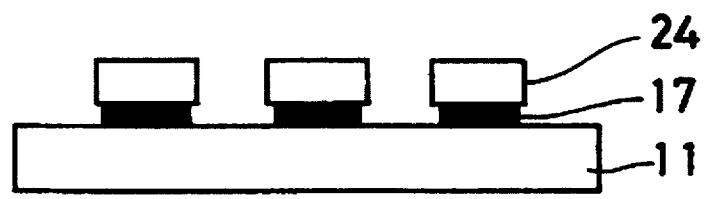

PHASE SHIFT LAYER-CONTAINING PHOTOMASK, AND ITS PRODUCTION AND CORRECTION

This application is a divisional of application Ser. No. 08/337,136 filed on Nov. 10, 1994 now U.S. Pat. No. 5,614,336, which is a continuation of 07/763,459, filed Sep. 20, 1991, abandoned.

BACKGROUND OF THE INVENTION

The present invention relates generally to photomasks used for producing high-density integrated circuits such as LSIs and VLSIs and more specifically to phase shift layer-containing photomasks used for forming fine patterns with high accuracy as well as their production and correction.

So far, semiconductor integrated circuits such as ICs, LSIs and VLSIs have been produced by repeating a so-called lithographic cycle wherein resists are applied on substrates to be processed, like Si wafers, and the substrates are then exposed to light through steppers to form the desired patterns, followed by development and etching.

The photomasks used in such a lithographic step and called "reticles" are now increasingly required to have much higher accuracy as current semiconductor integrated circuits are higher in performance and integration than ever before. Referring to a DRAM that is a typical LSI as an example, a dimensional variation of a five-fold reticle for a 1 megabit DRAM, i.e., of a reticle five-fold greater in size than the pattern to be exposed to light is required to have an accuracy of 0.15 μm even where the mean value=±3σ (σ is standard deviation). Likewise, five-fold reticles for 4- and 16-megabit DRAMs are required to have an accuracy of 0.1–0.15 μm and 0.05–0.1 μm, respectively.

Furthermore, the line widths of device patterns formed with these reticles must be much finer, say, 1.2 μm for 1-megabit DRAMs and 0.8 μm for 16-megabit DRAMs, and various exposure processes are now being studied to meet such demand.

With the next, . . . generation device patterns of, e.g. the 64 megabit DRAM class, however, stepper exposure systems using conventional reticles have been found to place some limitation on the resolution of resist patterns. Thus, a version of reticle based on a new idea, like those set forth in Japanese Provisional Patent Publication No. 58(1983)-173744, Japanese Patent Publication No. 62(1987)-59296, etc. and referred to as phase shift masks, has been proposed in the art. Phase shift lithography using this reticle is a technique designed to improve the resolving power and contrast of projected images by operating the phase of light transmitting through the reticle.

Phase shift lithography will now be explained with reference to FIGS. 2a to 2d and FIGS. 3a to 3d FIGS. 2a to 2d are diagrammatical sketches showing the principium of the phase shift process and FIGS. 3a to 3d are diagrammatical sketches illustrating a conventional process. FIGS. 2a and 3a are sectional views of reticles; FIGS. 2b and 3b show the amplitude of light on the reticles; FIGS. 2c and 3c depict the amplitude of light on wafers; and FIGS. 2d and 3d illustrate the intensity of light on the wafers. In FIGS. 2 or 3, reference numeral 1 stands for a substrate, 2 a light-shielding film, 3 a phase shifter and 4 incident light.

In the conventional process, as illustrated in FIG. 3a, the substrate 1 formed of glass, etc. is provided thereon with the light-shielding film 2 formed of chromium, etc., only to form a given pattern of light-transmitting regions. In phase shift lithography, however, the phase shifter 3 to cause phase reversal (with a phase difference of 180°) is mounted on one pair of adjacent light-transmitting regions on a reticle, as sketched in FIG. 2a. According to the conventional process, therefore, the amplitude of light on the reticle is in the same phase, as illustrated in FIG. 3b, as is the amplitude of light on the wafer, as depicted in FIG. 3c, with the result that the patterns on the wafer cannot be separated from each other, as sketched in FIG. 3d. By contrast, the phase shift lithography enables the adjacent patterns to be distinctly separated from each other, as illustrated in FIG. 2d, because the light transmitting through the phase shifter is reversed in phase between the adjacent patterns, as depicted in FIG. 2b, so that the intensity of light on the pattern boundary can be reduced to zero. With the phase shift lithography, even patterns which cannot heretofore be separated from each other are thus made separable from each other, thereby achieving high resolution.

Then, one example of conventional processes of producing phase shift reticles will be explained with reference to FIG. 14a to 14m which are a series of sectional views illustrating the steps of producing a typical phase shift reticle. As illustrated in FIG. 14a, a chromium film 12 is first formed on an optically polished substrate 11, and an ionizing radiation resist is uniformly coated and heated for drying thereon in conventional manners to form a resist layer 13. Then, a pattern is drawn on the resist layer 13 with ionizing radiations 14, as shown in FIG. 14b, followed by development and rinsing, thereby forming such a resist pattern 15 as sketched in FIG. 14c.

If required, the edges, etc of the resist pattern 15 are then cleared of unnecessary matter such as resist scums and whiskers by heating and descumming. Afterwards, portions of the chromium film exposed to open view between the resist pattern lines 15 are dry-etched using an etching gas plasma 16, as shown in FIG. 14d, thereby forming a chromium pattern 17. After etching in this manner, the resist pattern 15, viz., the remaining resist is incinerated out by an oxygen plasma 18, as shown in FIG. 14e, thereby obtaining such a complete photomask as shown in FIG. 14f.

Subsequently, this photomask is inspected to make a correction on the pattern, if required, followed by washing. After that, a transparent film 19 formed of, e.g. $SiO_2$ is formed on the chromium pattern 17, as depicted in FIG. 14g. Then, as depicted in FIG. 14h, an ionizing radiation resist 20 is formed on the transparent film 19 in similar manners as mentioned above, followed by alignment of the resist patterns 20, as shown in FIG. 14i. Subsequent drawing of a given pattern with ionizing radiations 21, development and rinsing give a resist pattern, as illustrated in FIG. 14j. Then, heating and descumming are effected, if required. After that, portions of the transparent film 19 exposed to open view between the resist pattern lines 22 are dry-etched by means of an etching gas plasma 23, as shown in FIG. 14k, to form a phase-shifter pattern 24. Finally, the remainder of the resist is incinerated out by an oxygen plasma 25, as illustrated in FIG. 14l. Through the foregoing steps, such a phase shift photomask containing phase shifters 24 as shown in FIG. 14m is completed.

According to the above-mentioned, conventional process for producing phase shift masks, wherein the transparent film 19 serving as a phase shifter has been patterned on the chromium pattern 17, it is required to draw a predetermined pattern on the resist layer 20 with the ionizing radiation exposure 21 and then develop, rinse, heat and descum to produce the resist pattern 22. It is further necessary to etch, either dry or wet, the resulting pattern after development to form the phase shifter pattern 24 and then remove the remainder of the resist. This results in an increase in the number of the production steps involved, making phase shifter pattern or other deficiencies likely to occur, and there is a rise in the production cost as well. If the number of the production steps is decreased, it will then be possible to prevent such deficiencies and achieve cost reductions.

Referring further to the above-mentioned, conventional process for producing phase shift reticles, how to correct usual reticles has already been established, should deficiencies be found prior to forming the phase shifters. However, how to correct the phase shifters of phase shift reticles has been unavailable as yet, thus presenting a problem that the phase shift reticles, even if in good shape, cannot possibly be put to practical use, should something wrong occur.

SUMMARY OF THE INVENTION

Having been accomplished with such situation in mind, this invention has for its object to provide a process for producing a phase shift layer-containing photomask employing a limited or reduced number of steps, resulting in reduced costs. The process is such as to make phase shifter pattern error or other deficiencies of the photomask less likely to occur. The invention may be similarly applied to correction of a photomask.

Before discussing the production process according to this invention, we will now give a brief explanation to spin-on-glass (hereinafter "SOG" for short) that is a film of an organic solvent solution of an organosilicon compound which has been converted into silicon oxide by coating, drying and heating. The starting materials for SOG used are a metal alkoxide such as tetraethoxysilane —$Si(OC_2H_5)_4$, bipolar solvents such as water and methanol and hydrochloric acid. To leave a methyl group (—$CH_3$) in SOG, tri-ethoxymethylsilane —$CH_3Si(OC_2H_5)_3$, diethoxydimethylsilane—$(CH_3)_2Si(OC_2H_5)_2$ or trimethylethoxysilane —$(CH_3)_3Si(OC_2H_5)$ may be added to tetraethoxystlane in an amount of a few % to a few tens %. One example of the mixing ratio of these starting materials is:

$Si(OC_2H_5)_4:CH_3Si(OC_2H_5)_3:H_2O:C_2H_5OH:HCl = 100:2:660:1050:6$

Upon mixed together, the starting materials start hydrolysis and polycondensation. These reactions are schematically expressed as follows:

Hydrolysis: $Si(OEt)_4 + H_2O \underset{}{\overset{H^+}{\rightleftharpoons}}$ $Si(OEt)_3OH, Si(OEt)_2(OH)_2,$ etc. $+ EtOH$ wherein $Et = C_2H_5$ Polycondensation: $\equiv Si—OH + HO—Si \equiv \longrightarrow$ $\equiv Si—O—Si \equiv + H_2O$ Total Reaction: $nSi(OEt)_4 + 0.5(4-a-b)H_2O \underset{}{\overset{H^+}{\rightleftharpoons}}$

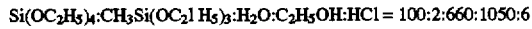

$[Si(OEt)_a(OH)_bO_{0.5(4-a-b)}]_n + (4-a)EtOH$

Through such hydrolysis and polycondensation, an Si—O polymer (polysilicate) having a low molecular weight is obtained. To obtain a methyl group-containing SOG, a mixture of $Si(OC_2H_5)_4$ with $CH_3Si(OC_2H_5)_3$ is used as one of the starting materials. The reaction scheme is then expressed as follows:

Hydrolysis: $Si(OEt)_4 + CH_3Si(OEt)_3 + H_2O \underset{}{\overset{H^+}{\rightleftharpoons}}$ $Si(OEt)_3OH + CH_3Si(OEt)_2(OH) +$ $Si(OEt)_2(OH)_2 + CH_3Si(OEt)(OH)_2,$ etc. $+ EtOH$ Polycondensation: $\equiv Si—OH + HO—Si \equiv \longrightarrow$ $\equiv Si—O—Si \equiv + H_2O$ Total Reaction:

$n/sSi(OEt)_4 + n/2CH_3Si(OEt)_3 + 0.5(4-a-b)_2O \underset{}{\overset{H^+}{\rightleftharpoons}}$

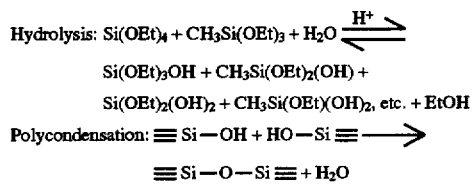

$[(CH_3)_{1/2}Si(OEt)_a(OH)_bO_{0.5(4-a-b)}]_n + (4-a)EtOH$

This low-molecular-weight SOG is spin-coated and soft-baked (at 80°–120°) on a substrate, whereby the molecular weight of SOG is slightly increased.

$[(CH_3)_{1/2}Si(OEt)_a(OH)_bO_c]_n \xrightarrow{\text{soft baking}}$

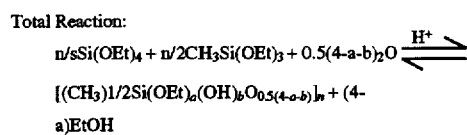

$[(CH_3)_{1/2}Si(OEt)_{a*}(OH)_{b*}O_{c*}]_{n*}$ wherein $a^* < a$, $b^* < b$, $c^* > c$, and $n^* > n$ Upon this substrate being further heated at 400°–500° C., dehydration and dealcoholization proceed to cause a drastic increase in molecular weight, giving an intimate SOG film.

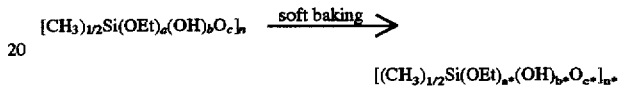

$[(CH_2)_{1/2}Si(OEt)_{a*}(OH)_{b*}O_{c*}]_{n*} \xrightarrow{\text{curing}} [(CH_3)_{1/2}Si(OH)_xO_y]_{n'}$ wherein n', x and y approximate to infinite, zero and two, respectively.

By using the methyl group-containing SOG in the spin-on glass process, the methyl group remains in the film, even after being heated at 400°–500° C. One example of the SOG structure after heated at 400°–500° C. is illustrated in FIG. 4.

When SOG is irradiated with electron beams, ion beams, radiation light such as X rays, γ rays and SOR (synchrotron orbital radiation) or laser light—all hereinafter called the energy beams—after the above-mentioned soft baking, polymerization takes place at the irradiated region, resulting in an increase. in molecular weight. Due to a difference in molecular weight, this SOG has the property of leaving its irradiated region intact, when it is developed with a solvent like an alcohol after irradiation.

By the way, when SOG contains an acid generator such as halogenoacids, onium salts and like other compounds of triphenyl-sulfonium-trifrate, tetrabromo-bisphenol, 1,1-bis-parachlorophenyl-2,2,2-trichloroethane, etc. is irradiated with the energy beams after soft-baking, the oxygen generator gives out an acid which in turn acts on the hydroxyl (—OH) and ethoxy (—$OC_2H_5$) groups remaining in SOG to allow dehydration or dealcoholization to proceed, resulting in an increase in molecular weight. When compared with the acid generator-free SOG, the acid generator-containing SOG has a greater sensitivity to incident energy. The SOG thus may be transformed to a higher molecular weight with a lower dosage of energy.

The production process according to this invention will now be explained at great length with reference to the accompanying drawings. FIGS. 1a to 1j are a series of sectional views illustrating the steps of producing a phase shift layer-containing photomask, wherein reference numeral 30 stands for a substrate, 31 an electrically conductive layer, 32 a light-shielding layer, 33 a resist layer, 34 ionizing radiations, 35 a resist pattern, 36 an etching plasma, 37 a light-shielding pattern, 38 an oxygen plasma, 39 a transparent film, 40 energy beams and 41 a phase shift pattern.

The electrically conductive layer 31 having a uniform thickness of 1 to 30 nm and the light-shielding layer 32 of 50 to 200 nm in thickness are first formed on the optically polished substrate 30 in this order, as shown in FIG. 1a. Then, an ionizing radiation resist formed of, e.g. chloromethylated polystyrene is uniformly spin-coated and heated for drying on the layer 32 in conventional manners to form the resist 33 of about 0.1 to 2.0 μm in thickness. Preferably, the substrate 30 is formed of quartz or synthetic quartz of high purity, if the phase shift mask is to be used with the shortwave ionizing or excimer laser light. However, other materials such as low-expanding glass, "white glass", "blue glass (SL)", $MgF_2$ and $CaF_2$ may also be used. The electrically conductive layer 31 may be formed of such materials as tantalum, molybdenum, tungsten and ITO mesa. Furthermore, the light-shielding layer 32 may be formed of a mono- or multi-layer of chromium thin films or, in the alternative, may be built up of such materials as chromium nitride, chromium oxide, tungsten, molybdenum, molybdenum silicide. Although varying with the type of resist, the heating treatment for drying may usually be carried out at 80° to 150° C. for about 20 to 60 minutes.

Then, a given pattern is drawn on the resist layer 33 by means of an electron beam (34) exposure unit, e.g. an electron beam drawer in conventional manners, as illustrated in FIG. 1b, followed by development with a developing solution composed mainly of such an organic solvent as ethyl cellosolve or ester. After that, alcohol rinsing gives such a resist pattern 35 as shown in FIG. 1c.

If required, the edges, etc. of the resist pattern 35 are then cleared of such unnecessary matters as resin scums or whiskers by heating and descumming. Afterwards, portions of the light-shielding layer 32 exposed to open view between the resist pattern lines 35 are dry-etched using the gas plasma 36, as illustrated in FIG. 1d, so as to form the light-shielding pattern 37. It is noted that, as apparent to those skilled in the art, this light-shielding pattern 37 may also be formed using wet etching instead of dry etching with the etching gas plasma 36.

After etching in this manner, the remaining resist 35 is incinerated out by the oxygen plasma 38, as shown in FIG. 1e to form a photomask in which, as shown in FIG. 1f, the electrically conductive layer 31 and the given light-shielding pattern 37 are formed on the substrate 30 in that order. It is noted that this treatment may be carried out using solvent release instead of incineration with the oxygen plasma 38.

Subsequently, this photomask is inspected to correct the pattern, if required, followed by washing. After that, the transparent film 39 is spin-coated on the light-shielding pattern 37 with the use of SOG, as illustrated in FIG. 1g, followed by prebaking (soft baking). This transparent film 39 may be formed of any desired material which is so sensitive to the energy beams emanating from an energy beam exposure unit that it can harden and has a high refractive index; in particular, it is preferable to use SOG containing a few % of such an acid generator as mentioned above, because it gives rise to a remarkable (a few hundredsfold) increase in sensitivity over usual SOG containing no acid generator. The energy beams used may include electron beams, ion beams, X rays, γ rays, radiating light such as SOR, laser light, and so on. By definition, the thickness d of the transparent film 39 is given by $$d = \lambda/2 \, (n-1)$$

wherein n is the refractive index of the material forming the transparent film 39, and λ is the wavelength of light for exposure.

The substrate with the transparent film 39 formed on it is aligned in conventional manners and, as illustrated in FIG. 1h, a given pattern is directly drawn by the energy beams 40 emanating from an electron beam exposure unit, etc. on the position on which the phase shifter is to be formed, followed by development with an organic solvent such as methanol. When the acid generator-containing SOG is used, post-exposure baking 42 is carried out at 80° to 100° C., as shown in FIG. 1i, followed by development. Subsequently after the substrate has been cleared of other SOG regions than the SOG regions forming the phase shift pattern 41 in this manner, it is baked to form an SOG film composed mainly of $SiO_2$. The baking to form $SiO_2$ should usually be carried out at a temperature as high as 400°–500° C. In order to enable the phase shifter to have the proper physical properties, however, sufficient results are obtainable by performing that baking at 150° to 450° C. for 30 to 120 minutes, although varying with the type of SOG used. It is thus possible to make such a phase shift reticle of high accuracy as shown in FIG. 1j. At this time, there is no fear of "charging-up" at all, because the charges carried by the energy beams 40 for pattern drawing are grounded through the electrically conductive layer 31. It is understood that even in the production process shown in FIG. 14a to 14m, a similar, electrically conductive layer 31 may be added to the side of the light-shielding layer 12 opposite to the substrate 11. This conductive layer 31 not only serves to prevent the above-mentioned charging-up but also functions as an etching stopper during the etching of the transparent film 19, thereby preventing a deficiency of the substrate 11 by overetching.

Subsequently, this photomask is inspected to make such a correction as mentioned below, for the purpose of illustration alone, on the pattern, and is then washed to give a complete phase shift photomask.

In what follows, how to make a stable correction on a deficiency of the phase shifter of the phase shift reticle according to this invention will now be explained with reference to FIGS. 5a to 5e.

FIGS. 5a to 5e are is a series of sectional sketches illustrating how to correct the phase shift layer of the phase shift mask (reticle) according to this invention, wherein reference numeral 30 stands for a substrate, 37 a light-shielding layer, 41 a phase shifter, 43 a defective portion of the phase shifter, 44 an SOG thin film, 45 an exposed region, 46 energy beams and 47 laser beams. As illustrated in FIG. 5b, SOG is first coated on such a phase shift reticle having the phase shift layer with a certain defective portion 43 as shown in FIG. 5a, and is then heated for drying to form an SOG layer 44.

In this connection, the SOG layer 44 may usually be coated on the reticle to a thickness of about 0.3 to 0.6 μm as measured after polymerization, although this depends upon, the wavelength used with the photomask, the refractive index of the SOG layer 44 and other factors, and the heating treatment for drying may usually be carried out at 100° to 180° C. for about 30 minutes, although this again varies with the type of SOG. As will become apparent from the action of the phase shift layer 41, the thickness of the SOG layer 44 must be selected such that the phase shift layer 41 after correction is tantamount to a predetermined phase shift amount (180°) inclusive of the corrected portion.

Following SOG coating and drying, the defective portion 43 of the phase shifter 41 is irradiated with the energy beams commensurate thereto to increase the molecular weight of the exposed region 45 and leave it intact after development. The energy beams 46 used to this end may be electron beams, laser, ion beams, radiations such as X rays, γ rays and SOR, or the like.

Then, this substrate is developed by five-minute immersion in an alcohol to obtain a phase shift reticle in which the defective portion 43 of the phase shifter 41 is corrected by SOG 45.

Subsequently, this substrate is baked to form an SOG film composed mainly of $SiO_2$. At this time, a temperature as high as 400° to 500° is usually needed for the baking to form $SiO_2$. It is found, however, that 30- to 120-minute baking at 150°–450° C. is good enough for the purpose of making the physical properties of the phase shifter reasonable, although this depends upon the type of SOG.

Through the above-mentioned steps, the correct,on of the deficiency 43 of the phase shifter 41 is fundamentally completed. In order to obtain a phase shifter which is more improved in formability or surface properties, the corrected portion 45 may be further irradiated with laser, ion or other beams 47 for shaping, as illustrated in FIG. 5d. In this manner, it is possible to prepare a phase shift reticle of much higher accuracy, as shown in FIG. 5e.

What forms, and how to form, the phase shift layer 41 whose defective portion 43 is to be corrected by converting SOG into $SiO_2$ are not limited by the explanation made in conjunction with FIG. 5; it may be formed of any desired material by any desired process. However, it is noted that when there is a large difference in refractive index between SOG placed on the deficiency to be corrected and the phase shift layer 41 located adjacent thereto, undesired reflection takes place on the boundary surface. In other words, this process can be said to lend itself best fit for a phase shift reticle the phase shift layer 41 of which is formed of $SiO_2$ obtained from SOG by sputtering, vapor deposition, CVD or other techniques.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIGS. 1a to 1j are a series of sectional sketches for illustrating the first process for producing a phase shift photomask according to this invention, FIGS. 6a to 6g are a series of sectional sketches for illustrating the second production process, FIG. 7 is a view showing the structure of one example of the electrically conductive compound used with the second process, FIGS. 9a to 9d are a series of sketches for illustrating how to build up an LB film by the horizontal deposition technique, FIGS. 10a to 10g and 11a to 11k are a series of sectional sketches for illustrating the production processes of Examples 4 and 5, respectively, FIG. 12 is a sectional sketch of one example of the self-alignment type of phase shift photomask.

DESCRIPTION OF THE PREFERRED EMBODIMENTS

Figure 1G:
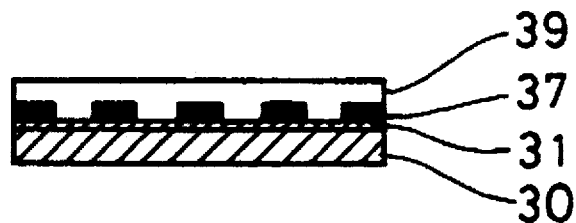
Figure 1H:
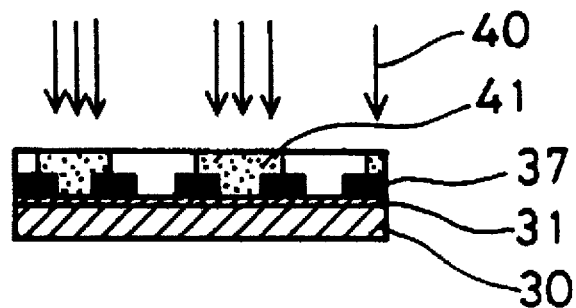
Figure 1I:
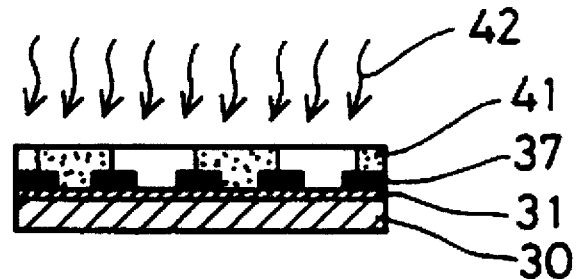
Figure 1J:
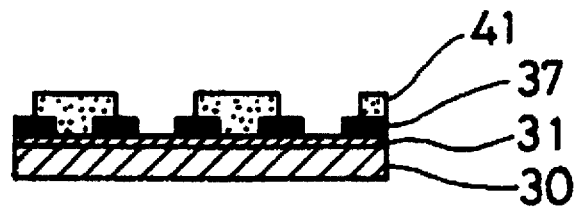
Figure 2A:
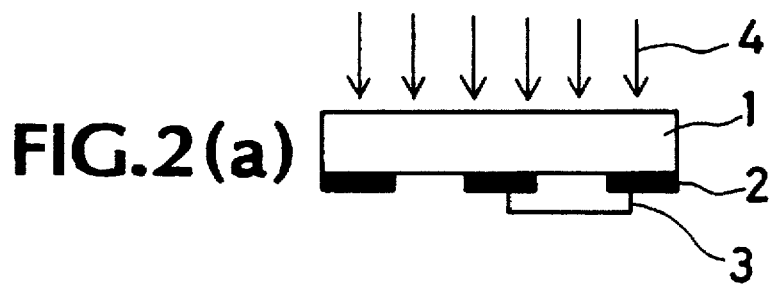
FIGS. 2a to 2d are a series of sketches illustrating a phase shift process.
Figure 2B:
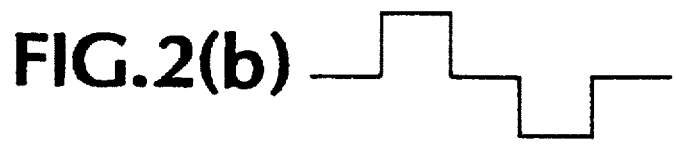
Figure 2C:
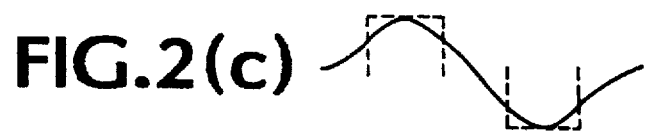
Figure 2D:
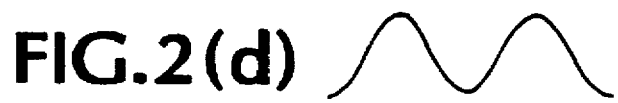
Figure 3A:
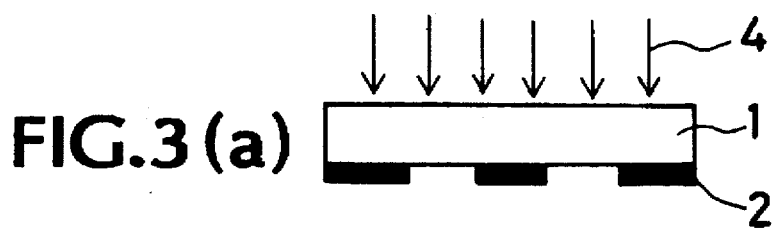
FIGS. 3a to 3d are a series of sketches illustrating the principles of a conventional process, FIG. 4 are diagrams illustrating examples of SOGs after formed by heating.
Figure 3B:
Figure 3C:
Figure 3D:
Figure 5A:
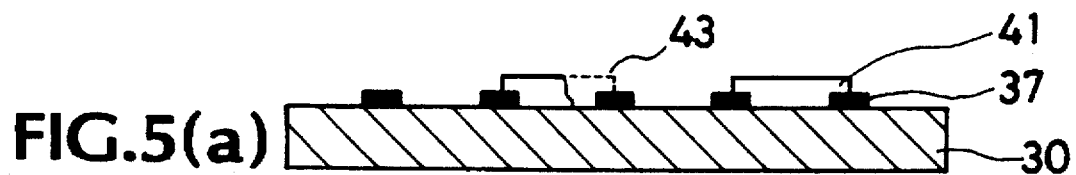
FIGS. 5a to 5e are a series of sketches for illustrating how to correct a phase shift photomask according to this invention.
Figure 5B:
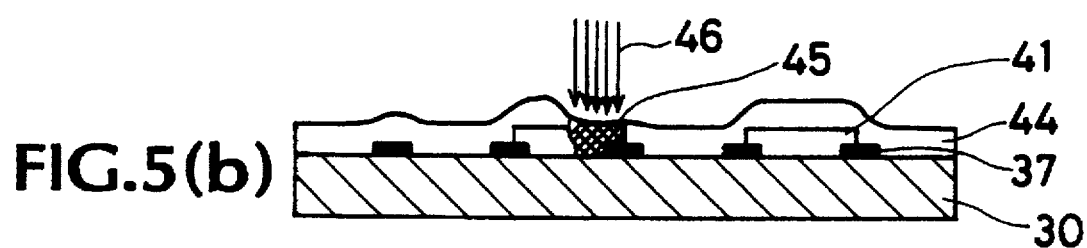
Figure 5C:
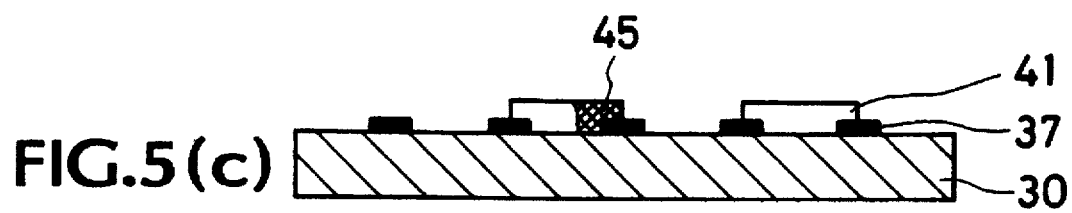
Figure 5D:
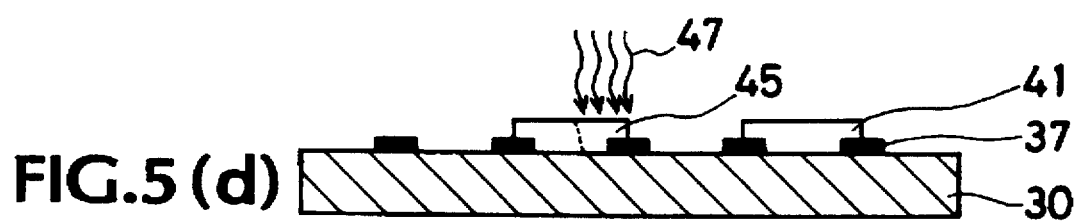
Figure 5E:
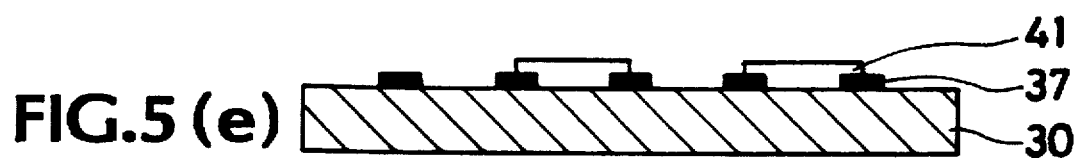

The present invention will now be explained in greater detail with reference to the preferred examples thereof.

EXAMPLE 1

An optically polished substrate of 5 in. squares, which was formed of synthetic quartz of high purity, was provided thereon with a thin film of Ta serving as a 200-nm thick, electrically condutive layer and a double-layer structure of a 800-nm thick thin film of chromium and a 400-nm thick thin film of low-reflecting chromium, serving as a light-shielding layer, to form a mask substrate or blank, and a resist solution of chloromethylated polystyrene was coated on this mask substrate by means of spin coating and prebaked at 120° C. for 30 minutes to obtain a uniform resist film of 0.6 μm in thickness.

Then, a pattern was drawn on the resist film using electron beams with an accelerated voltage of 20 kV at an exposure dose of 20 μC/cm$_2$. After exposure, this substrate was developed with a developer comprising a mixed solution of isoamyl acetate with ethyl cellosolve for 60 seconds, and was thereafter rinsed with isopropyl alcohol for 30 seconds to obtain a resist pattern. Subsequently, the resist pattern was post-baked at 140° C. for 30 minutes and descummed with an oxygen plasma of 1 Torr and 100 W for 2 minutes. After that, an exposed portion of the substrate was dry-etched at an output of 300 W in a plasma consisting of carbon tetrachloride and oxygen for 8 minutes, using the resist pattern as a mask. Then, the remaining resist was incinerated out with an oxygen plasma of 2 Torr and 400 W to obtain a photomask which was to be provided with a phase shifter. Following confirmation of the quality of the photomask produced in this manner, SOG was spin-coated on this mask to a film thickness given by $$d=\lambda/2(n-1)$$

wherein λ=the wavelength of exposure light and n=the refractive index of SOG, followed by heating for drying. Then, with a drawer using electron beams at an accelerated voltage of 30 kV, a pattern was directly drawn on a given position of the photomask, while detecting alignment marks thereon. After that, this substrate was developed with a methanol developer for 30 seconds, followed by baking at 450° C. for 1 hour. In this manner, a phase shift photomask containing a shifter layer of $SiO_2$ obtained from SOG was obtained.

A positional deviation of the phase shifter layer of the thus produced phase shift mask was found to lie within a value of ±0.1 μm where the mean value=3σ (σ=standard deviation), indicating that it was highly accurate.

Pattern distortion or other defect was not observed at all around the photomask.

EXAMPLE 2

By means of spin coating, SOG was applied on a phase shift reticle which was produced by Example 1 but in which a part of the phase shifter was missing, and was then prebaked at 150° C. for 30 minutes to obtain an SOG film of 450 nm in thickness.

Then, the deficient portion of the phase shifter was exposed to ion beams at an accelerated voltage of 150 kV according to the deficient pattern. After exposure, this substrate was developed with ethanol for 5 minutes, and was further rinsed with isopropyl alcohol for 2 minutes to wash off other SOG regions than the exposed region.

Subsequently, this, substrate was heated at 250° C. for 30 minutes and at 450° C. for a further 60 minutes to bake SOG.

Through the above-mentioned steps, the defective portion of the phase shifter could be completely corrected.

In accordance with the process for producing phase shift layer-containing photomasks according to this invention, some steps including resist coating, exposure, development, SOG etching and release of the remainder of resist, which have been carried out after SOG coating in conventional processes, can be dispensed with by making use of the property of phase shifter-forming SOG that it is solidified by irradiation of the energy beams. By performing only the steps of exposure, development and baking after SOG coating, it is thus possible to reduce the number of steps involved, the cost of production and the incidence of deficiencies without making substantial modifications to conventional processes of producing photomasks by ionizing radiation lithography.

In accordance with the correcting process of this invention, it is also possible to correct phase shifter deficiencies easily by extensional application of ordinary lithographic techniques involving formation of SOG thin films and energy beam exposure. Thus, not only is putting phase shift photomasks to practical use easily achievable, but it is also possible to impart high quality to phase shift photomasks heretofore rejected as throw-outs for recycling purposes.

In connection with the foregoing, reference will now be made in the following Example 3 to a more practical process for producing phaseshift layer-containing photomasks, which can effectively prevent a charging-up phenomenon at the time of providing phase shift reticles with phase shifters to eliminate pattern distortions due to the charging-up phenomenon, thereby making it possible to produce highly accurate phase shift reticles.

EXAMPLE 3

FIGS. 6a to 6g are a series of sectional sketches illustrating the steps of one embodiment of the process for producing such photomasks. As shown in FIG. 6a, an $SiO_2$ film is first provided on a reticle with SOG or by means of sputtering or other techniques in the form of a shifter layer 54. Subsequently, an ionizing radiation resist is uniformly coated on the phase shifter layer 54 by means of conventional techniques, e.g. spin coating, and is then heated thereon for drying to form a resist layer 55 of about 0.1 to 2.0 µm in thickness, as shown in FIG. 6b. The heat treatment for drying may usually be carried out at 80° to 200° C. for about 20 to 60 minutes, although this depends upon the type of resist used. Then, this resist layer 55 is provided thereon with an electrically conductive layer 56. The conductive layer 56 of about 0.05 to 0.5 µm in thickness, if formed as of a tetracyanoquinodimethane (TCNQ) complex, may be obtained by dissolving it in an organic solvent such as cyclohexane and coating the solution uniformly on the resist layer 55 by means of spin coating or other conventional technique, followed by heating for drying—see FIG. 6b. The heat treatment for drying may be carried out at 50° to 100° C. for about 2 to 10 minutes, although this again depends upon the type of TCNQ complexes used.

When a metal film is used as the conductive film sufficient electrical conductivity may be obtained by forming such a metal as aluminium, titanium, chromium, gold or copper on the resist layer 55 to a thickness of 200 to 3000 Å by means of vapor deposit/on, sputtering or other technique.

Then, as illustrated in FIG. 6c, the resist layer 55 is aligned as conventional, and a pattern is drawn thereon by ionizing radiations 57 with the use of exposure hardware such as an electron beam drawer. In this case, it is possible to draw the pattern with high accuracy, because excessive charges are so grounded through the conductive layer 56 formed on the resist film 55 that alignment marks can be easily detected with no occurrence of the charging-up phenomenon.

Subsequently, the pattern is developed with a given developing solution and rinsed with a given rinsing solution to form such a resist pattern 58 as depicted in FIG. 6d. Use of an ordinary alkali development type of resist gives rise to coincident release of the conductive layer 56 at the time of development. Also, when the conductive layer 56 uses a type of resist insoluble in the developer, the pattern may be formed by releasing the conductive layer 56 with an organic solvent and developing it with a predetermined developer.

After heating for drying and descumming have been carried out, if required, portions of the transparent film 54 exposed to open view between lines of the resist pattern 58 are dry-etched by an etching gas plasma 59, as shown in FIG. 6d, to form a phase shifter pattern 54—see FIG. 6e. Then, the remaining resist is incinerated out by an oxygen plasma 60, as shown in FIG. 6f. Through the above-mentioned steps, such a phase shift mask containing phase shifter 54 as shown in FIG. 6g is completed.

The thus formed phase shift pattern provides a high-quality phase shift mask unlikely to suffer a positional deviation or accuracy deterioration, which may otherwise occur due to the charging-up phenomenon at the time of pattern exposure.

Incidentally, when the electrically conductive layer 56 of FIG. 6b is coated on the resist layer 55 by means of spin coating or other conventional technique, there is a fear that because the conductive layer has a thickness as large as 100 to 300 nm and is poor in thickness uniformity, the resist layer decreases in resolution and suffers a large in-plane dimensional variation. Referring further to coating techniques, such as when an electrically conductive polymer based on an organic solvent is coated on a water-soluble resist by means of spin coating, it is required to use a water-soluble intermediate layer formed as of polyvinyl alcohol at an additional separate step; this results in an increase in film thickness and hence a deterioration of the resolution of the resist layer.

To avoid these, the electrically conductive layer 56 may be coated on the resist layer by means of the Langmuir-Blodgett technique (the LB technique). FIG. 7 shows the structure of N-docosylpyridinium.$(TCNQ)_2$ that is one example of electrically conductive compounds used to this end. Other organic, electrically conductive materials may also be used, including polyacetylene, polythiophene, polypyrrole, polythiadyl, polyazulenium, polyindene, polyindole, poly-para-phenylene, polynaphthylene, polyanthracene, polyaniline, polyphthalocyanine and polyferrocene.

Referring to how to make an LB conductive film used as the conductive layer 56, such an electrically conductive compound shown in in FIG. 7 is spread on the surface of water in the form of a chloroform solution to form a monolayer. This monolayer is deposited by such vertical dipping method as shown in FIG. 8a to 8i or such a horizontal lifting method as shown in FIGS. 9a to 9d on the resist layer 55 on which the shifter layer 54 is to be patterned, thereby forming a multilayer.

Figures 8A, 8B, 8C:
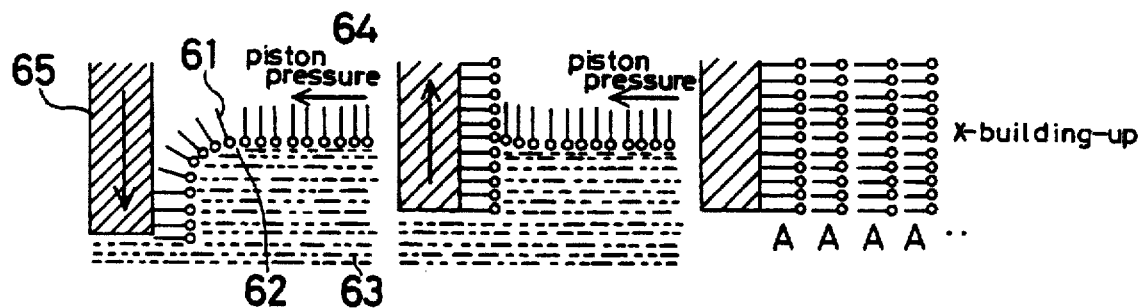
FIGS. 8a to 8i are a series of sketches for illustrating how to build up an LB film by the vertical dipping technique.
Figures 8D, 8E, 8F:
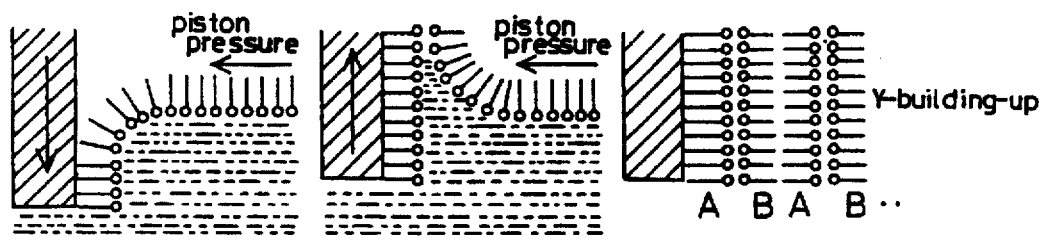
Figures 8G, 8H, 8I:
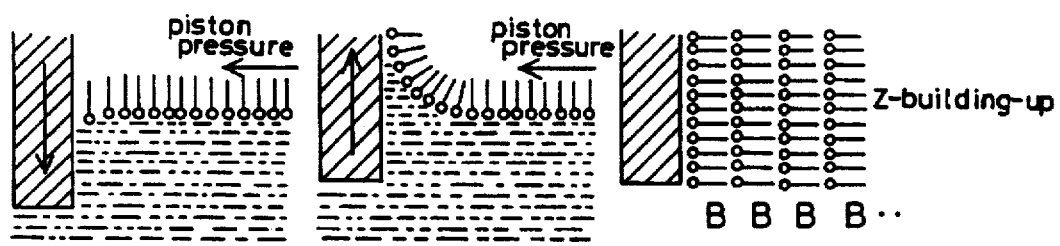

Referring first to the vertical dipping technique shown in FIGS. 8a to 8c, a substrate 65 made hydrophobic with iron stearate, etc. is vertically dipped in a subphase, while a piston pressure 64 is loaded to the surface of an underlying water 63 in which a monolayer consisting of hydrophobic and hydrophilic groups 61 and 62 has been formed, whereby the monolayer is transferred on the side of the hydrophobic group 61 onto the substrate 65. But the monomolecular film is not transferred onto the substrate, while it is drawn up. Such a film is called the X film. According to the technique shown in FIGS. 8d to 8f, the film is transferred onto the substrate during both periods of dipping and drawing-up—called the Y film, and according to the technique depicted in FIGS. 8g to 8i, the film is not deposited onto the substrate during dipping but transferred onto the substrate during drawing-up—referred to as the Z film.

Referring further to the horizontal deposition technique shown in FIGS. 9a to 9c, a piston pressure 64 is applied to a monolayer formed on the surface of water divided by a first partition 66 to bring a substrate 64 into horizontal contact with the monolayer for deposition of hydrophobic groups 61 onto the surface of the substrate 65—see FIG. 9a. After that, a second partition 67 is moved to the portion of the substrate 65 in no contact with the first partition 66 to draw up the substrate 65—see FIGS. 9b and 9c. Then, the operations (a) to (c) are repeated to form a multilayer having a given thickness—see FIG. 9d. In this case, only the X film is formed.

In the following Examples 4 and 5, reference will be made to the process for producing a phase shift photomask containing a phase shift pattern standing upright on the side, which can prevent deterioration, of a light-shielding film at the time of etching the phase shift pattern.

EXAMPLE 4

FIGS. 10a to 10g are a series of sectional sketches illustrating one embodiment of the process for producing this phase shift reticle. As shown in FIG. 10a, provided is a chromium reticle including a glass substrate 73 and a light-shielding pattern 75 thereon, which is built up of a double-structure light-shielding film consisting of chromium and low-reflecting chromium layers. It is noted that a layer 74 is a transparent, electrically conductive film for preventing "charging-up" and other phenomena.

Then, an SOG film 76 is formed all over the surface of the chromium reticle to a thickness meeting the following relation:

$$d = \lambda/2(n-1)$$

Instead of this SOG film 76, use may be made of films formed of $SiO^2$ by sputtering and $SiO_2$ and $SiN$ by CVD (chemical vapor deposition)

Then, an ionizing radiation resist layer containing a dye and composed mainly of novolak resin 77 is formed on top of the SOG film 76, followed by alignment. After that, a given pattern is drawn on the resist layer by ionizing radiations emanating from electron beam exposure hardware, etc., and is then developed and rinsed to form an ionizing radiation resist pattern 77, as sketched in FIG. 10c.

As the ionizing radiation resist, use may be made of any other desired resist functioning to reduce light transmittance.

Then, as illustrated in FIG. 10d, a photoresist 78 composed mainly of novolak resin is coated all over the surface of chromium reticle on which the ionizing radiation resist pattern 77 has been formed. To this end, use may also be made of any other desired photoresist resistant to dry etching.

Then, the chromium reticle is exposed to light all over the surface from the back side of the mask to form a photoresist pattern 78, as shown in FIG. 10e. When a dye-containing resist is used as the ionizing radiation resist 77 formed on the shifter layer 76 for forming the photoresist pattern 78, the ionizing radiation resist 77 absorbs light, so that the portion of the photoresist pattern 78 including that resist 77 drops in light transmittance. This assures that the photoresist 78 remaining on the ionizing radiation resist 77 comes to have a thickness sufficient for it to serve as an etching mask.

Then, as sketched in FIG. 10f, the SOG layer 76 is dry-etched with a reactive plasma 80, while using the thus formed photoresist pattern 78 as a mask, to form a phase shifter mask 76.

Finally, as depicted in FIG. 10g, the remaining resist is incinerated out by an oxygen plasma to obtain a complete phase shift photomask.

In conjunction with the above-mentioned process, it is noted that when the resist used as the ionizing raidation resist pattern 77 is resistant to dry etching, it is not always required to incorporate a dye into that resist. When a dye-free, dry etching-resistant resist is used, the photoresist pattern 78 is formed only on the light-shielding pattern in the steps of FIGS. 10d and 10e by the full-exposure 79 through the back side of the mask. In carrying out dry etching in the step of FIG. 10f, the photoresist pattern 78 on the light-shielding pattern 75 and the ionizing radiation resist pattern 77 on the position to be provided with the phase shifter then serve together as a dry etching mask to protect the light-shielding and phase shifter layers 75 and 76 against etching.

EXAMPLE 5

Figure 11A:
Figure 11B:
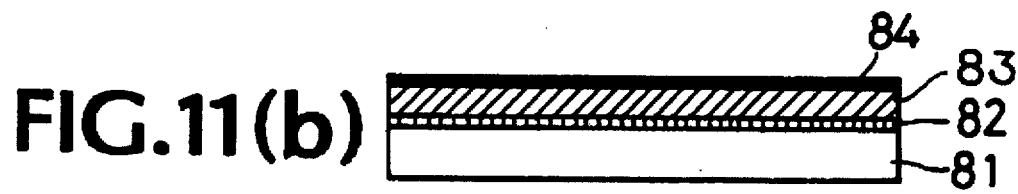

Example 4 is given to explain one example of the phase shift photomask in which the phase shifter layer 76 is provided on the substrate with the light-shielding pattern 75 formed on it. However, the above-mentioned production process is also applicable to a phase shift photomask in which a light-shielding pattern is provided on a substrate with a phase shifter layer formed on Referring now to FIGS. 11a to 11k, provided is a quartz substrate 81 with a transparent, electrically conductive film 82 formed on it, as sketched in FIG. 11a. Then, as depicted in FIG. 11b, an SOG film 83 is formed on this conductive film to a thickness meeting the following relation:

$$d = \lambda/2(n-1)$$

And formed on this film 83 is a light-shielding film 84 consisting of chromium and low-reflecting chromium.

Figure 11C:
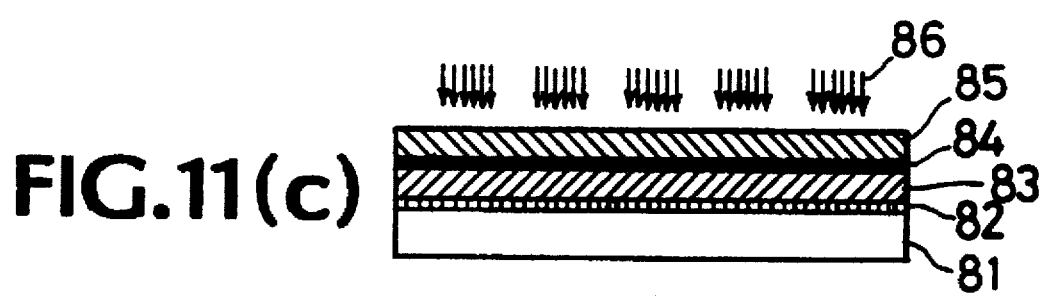
Figure 11D:
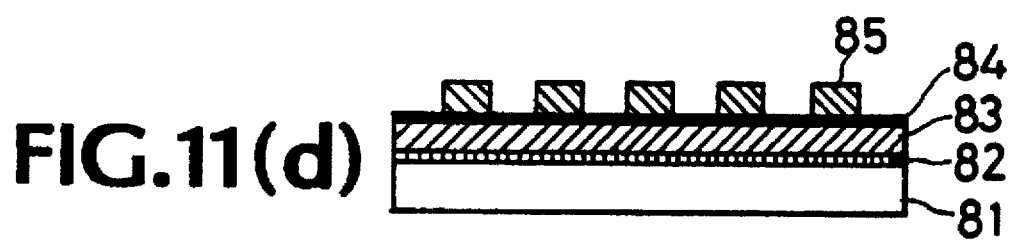
Figure 11E:
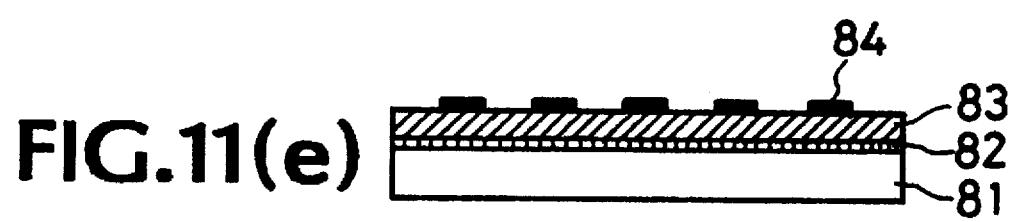

As sketched in FIG. 11c, this substrate is coated thereon with an ionizing radiation resist 85, on which a light-shielding film pattern is drawn by ionizing radiations 86 emanating from electron beam exposure hardware, etc. Subsequent development and rising gives an ionizing radiation resist pattern 85. Using this resist pattern 85 as a mask, the light-shielding film 84 is etched to form such a light-shielding pattern 84 as shown in FIG. 11e.

Figure 11F:
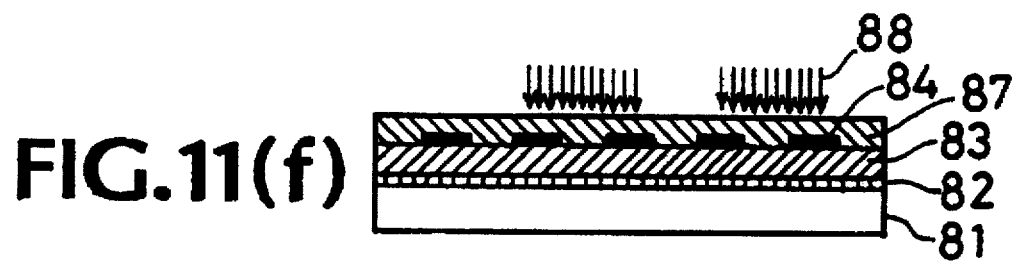

As illustrated in FIG. 11f, this substrate is coated thereon with a dye-containing ionizing radiation resist 87, followed by alignment. After that, a pattern is drawn on a portion corresponding to the phase shifter by ionizing radiations 88 emanating from electron beam exposure equipment, etc. Subsequent development and rinsing gives such an ionizing radiation resist pattern 87 as depicted in FIG. 11g.

Then, a photoresist 89 is coated all over the surface of this reticle, as shown in FIG. 11h, and the reticle is full-exposed to ultraviolet rays 90 from the back side of the mask. Subsequent development and rinsing gives a photoresist pattern 89 on portions corresponding to the phase shifter pattern and chromium pattern 84, as shown in FIG. 11i.

Then, an SOG layer 83 is dry-etched using the formed photoresist pattern 89 as a mask, as shown in FIG. 11j, thereby to form a phase shifter pattern 83, and the remaining resist is incinerated out by an oxygen plasma to obtain a complete phase shift mask, as shown in FIG. 11k.

According to the process of Examples 4 and 5 wherein the mask for dry etching is formed in a self-alignment manner, it is possible to prevent the light-shielding film from suffering damage at the time of dry etching. To be more precise, lowerings of the optical density and surface reflectivity of the light-shielding film can be reduced and the side of the phase-shifter pattern can be kept upright well. It is thus possible to prevent the low-reflecting layer of the light-shielding film from suffering damage-and avoid a lowering of the optical density of the light-shielding film, thereby to prevent deterioration of the pattern transferred on the wafer.

Incidentally, such a phase shift process as shown, in FIGS. 2a to 2d lends itself well fit for simple patterns. In some cases, however, it does not serve well for complicated patterns like usual device patterns; difficulty is encountered in designing shifter patterns or, in the worst, shifters cannot be designed, although this depends upon pattern schemes.

For that reason, a self-alignment type of phase shift mask has recently been envisaged—see "NIKEEI MICRODEVICES", No. 1, pp. 78–79, 1990. As sketched in the sectional view of FIG. 12, this self-alignment type of phase shift mask includes a phase shift layer 24 of a given width overhanging the associated pattern 17, whereby the contrast of the pattern edge is stressed to improve resolution on the same principle as in the phase shift process.

In the following Example 6, reference will be made to the self-alignment type of phase shift mask according to this invention and how to make

EXAMPLE 6

Figure 13A:
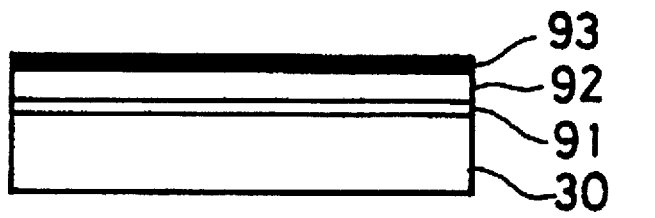
FIGS. 13a to 13j are a series of sectional sketches for illustrating the production process of Example 6.

FIGS. 13a to 13j are a series of sectional sketches showing the process for producing a photomask containing this phase shift layer. As illustrated in FIG. 13a, an optically polished substrate 30 is provided thereon with a uniform etching stopper layer 91 of 1 to 100 nm in thickness, a transparent film layer 92 of 100 to 1000 nm in thickness and a light-shielding layer 93 of 50 to 200 nm in thickness in this order to form a photomask blank.

Then, an ionizing radiation resist such as chloromethylated polystyrene is uniformly coated on this photomask blank by spin coating or other conventional technique and heated thereon for drying to form a resist layer 94 of about 0.1 to 2.0 µm in thickness.

Preferably, the etching stopper layer 91 is a thin film formed of tantalum, molybdenum, tungsten, silicon nitride or like material. Usually, the resist is heated for drying at 80° to 200° C. for about 20 to 60 minutes, although this depends on the type of resist.

Figure 13B:
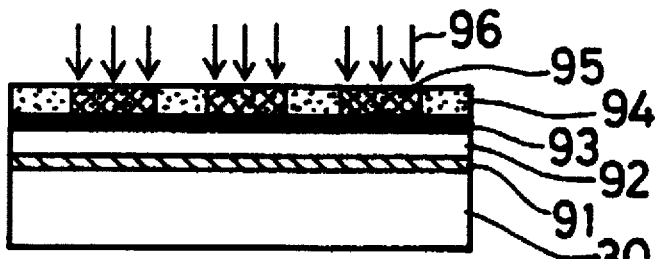
Figure 13C:
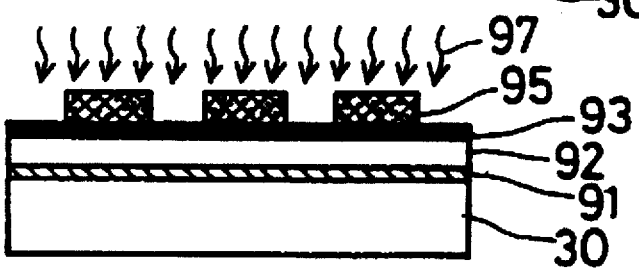

Then, as sketched in FIG. 13b, a given pattern is drawn on the resist layer 94 in conventional manners using ionizing radiations 96 emanating from such exposure hardware as an electron beam drawer, followed by developement with a developer composed mainly of an organic solvent such as ethyl cellosolve or ester. After that, alcohol rinsing gives such a resist pattern 95 as depicted in FIG. 13c.

If required, heating and descumming are carried out to clear the edges, etc. of the resist pattern of unnecessary residues such as resist scums or whiskers. Then, portions of the light-shielding layer 93 exposed to open view between the lines of the resist pattern 95, as can be best seen from FIG. 13c, are dry-etched by an etching gas plasma 97 to form a light-shielding pattern 98—see FIG. 13d.

Figure 13D:
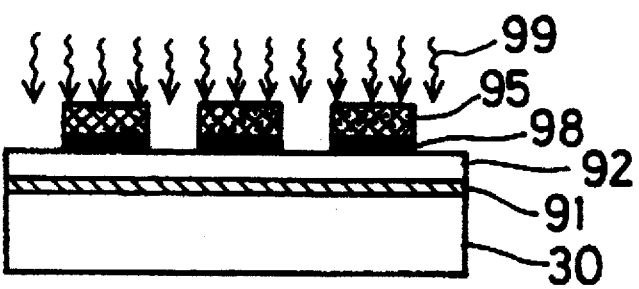
Figure 13E:
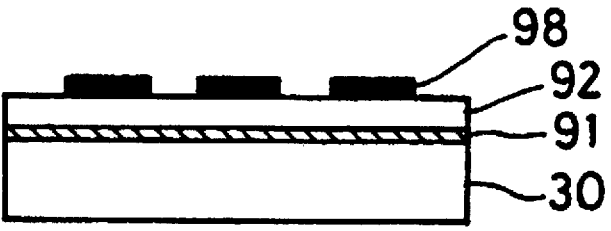

After etching in this manner, the remaining resist 95 is incinerated out by an oxygen plasma 99, as depicted in FIG. 13d, thereby to obtain a photomask in which, as shown in FIG. 13e, the etching stopper layer 91 and given light-shielding pattern 98 are built up on the substrate in this order.

Figure 13F:
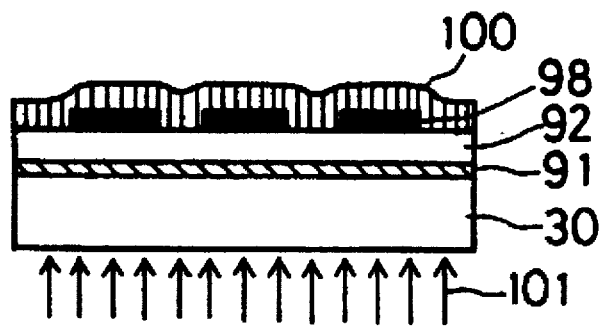

Subsequently, this photomask is inspected to correct the pattern, if required, followed by washing. After that, a photoresist such as OFPR-800 is uniformly coated on the light-shielding pattern 98 by means of spin coating or other conventional technique, as shown in FIG. 13f and heated thereon for drying into a photoresist layer 100 of about 1 to 2 µm in thickness.

Subsequently, the above-mentioned resist layer 100 is exposed to light 101 from the back side of the glass substrate 30, and is developed with an aqueous alkali solution composed mainly of tetramethylammonium hydroxide and rinsed with pure water to form a pattern in which a resist pattern covers the light-shielding pattern 98.

Figure 13G:
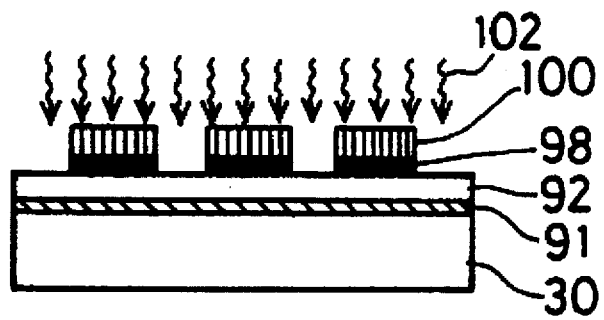
Figure 13H:
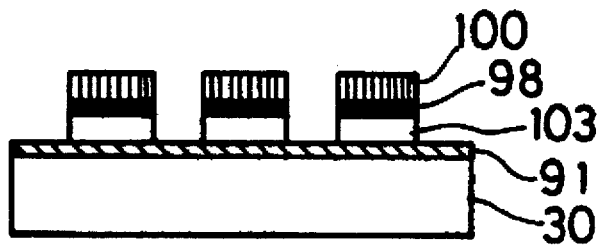

Then, portions of the shifter layer 92 exposed to open view between the lines of this resist pattern, as can be best seen from FIG. 13g, is dry-etched by an etching gas plasma 102 to form a shifter pattern 103 see FIG. 13h.

Subsequently, this substrate is treated with an etching solution composed mainly of ammonium cerium (IV) nitrase to side-etch the light-shielding film sandwiched between a shifter 103 and the resist 100. The amount of this side etching is usually in the range of about 0.1 to 0.5 µm, although depending upon the type and size of pattern.

Figure 13I:
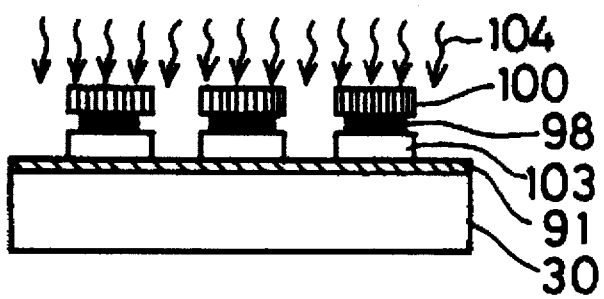
Figure 13J:
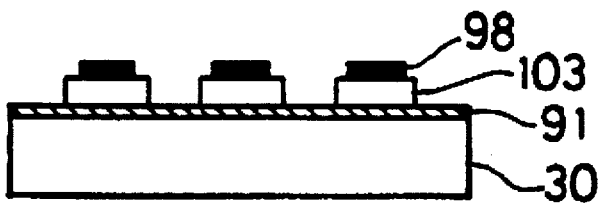
Figure 14A:
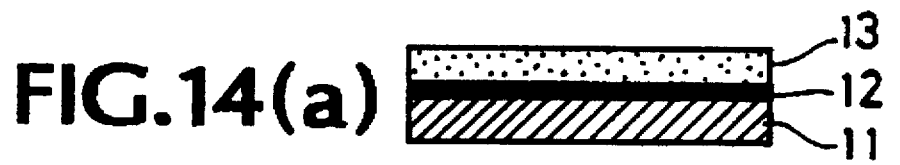
FIGS. 14a to 14m are a series of sectional views for illustrating a conventional process for producing phase shift masks.
Figure 14B:
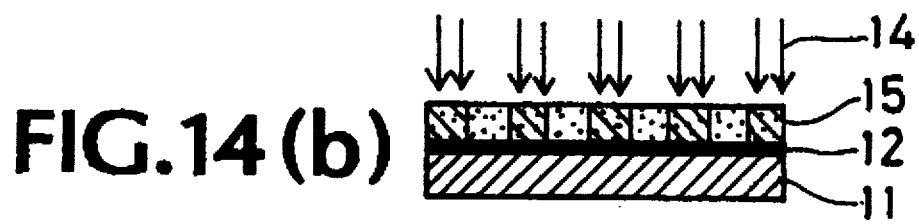
Figure 14C:
Figure 14D:
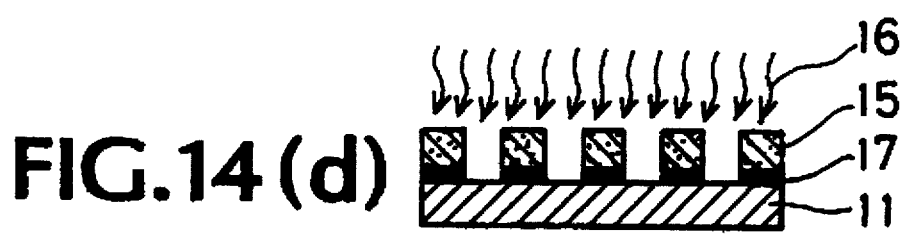
Figure 14E:
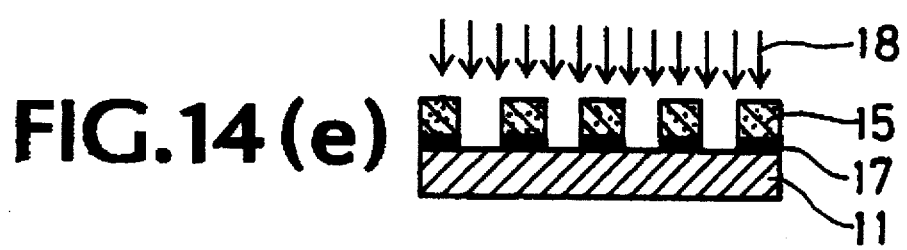
Figure 14F:
Figure 14G:
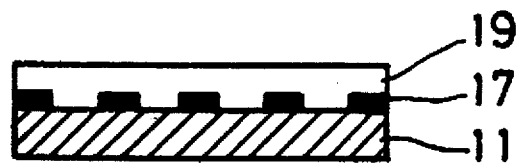
Figure 14H:
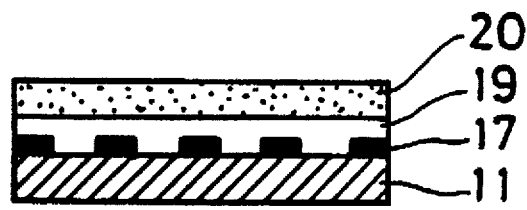
Figure 14I:
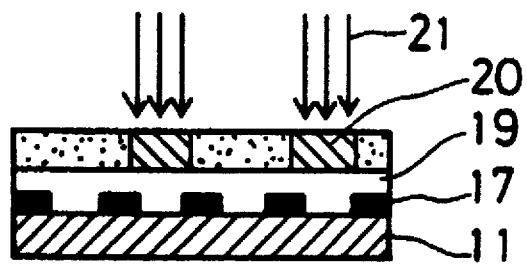
Figure 14J:
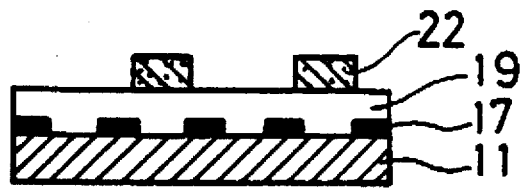
Figure 14K:
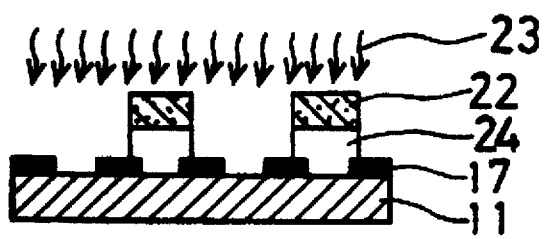
Figure 14L:
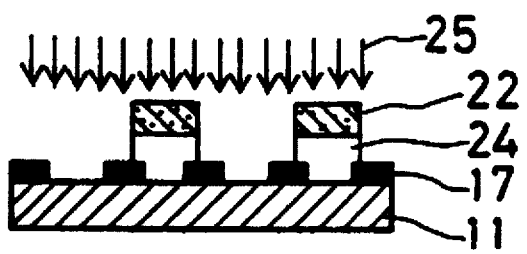
Figure 14M:
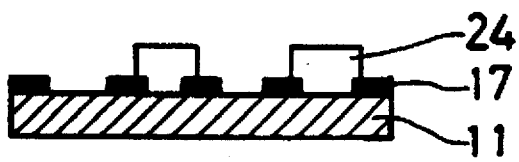

After etching in this manner, the remaining resist 100 is incinerated out by an oxygen plasma 104, as shown in FIG. 13i, to obtain such a complete self-alignment type of phase shift mask as shown in FIG. 13j.

According to the above-mentioned process wherein as the substrate to be processed, use is made of a photomask blank of the structure that a substrate material formed as of glass is provided thereon with the etching stopper layer, transparent film layer and light-shielding thin film in this order, it is possible to stably and easily produce photomasks which are of high resolving power, high contrast and high accuracy and can be easily inspected and corrected.

What is claimed is:

1. A process for producing phase shift layer-containing photomasks, characterized by comprising at least the steps of:

coating a starting material for spin-on-glass uniformly on a substrate, drawing a pattern directly on the coating spin-on-glass layer with energy beams, developing the substrate with a solvent after the pattern drawing with energy beams to wash off an excessive spin-on-glass portion other than the spin-on-glass layer irradiated with the ionizing radiations, and baking the post-development substrate.

2. A process for correcting a phase shift layer-containing photomask, characterized by comprising the steps of:

coating a starting material for spin-on-glass uniformly on a photomask containing a phase shift layer built up of a substrate, a light-shielding pattern and a phase shifter pattern, said phase shifter pattern being partly defective;

heat-treating the photomask with the starting material for spin-on-glass coated thereon;

irradiating the defective portion of the phase shifter pattern with the starting material for spin-on-glass coated thereon with energy beams commensurate to the geometry of said defective portion;

developing the post-irradiation substrate with a solvent to wash off an excessive spin-on-glass portion other than the spin-on-glass layer irradiated with energy beams, and baking the post-development substrate.

3. A process for producing a phase shift layer-containing photomask including a light-shielding pattern and a phase shifter for making a phase difference between transparent regions isolated by a light-shielding region from each other and located adjacent to each other, characterized in that said phase shifter is formed by the steps of:

forming an ionizing radiation resist pattern on a portion commensurate to said phase shifter pattern on the surface of a substrate on which at least a light-shielding pattern and a transparent film of uniform thickness are provided, using an ionizing radiation resist;

coating a photoresist all over the surface of the substrate with the ionizing radiation resist pattern formed thereon and full-exposing the photoresist to light from the back side of the substrate, thereby to form a photoresist pattern on at least a portion commensurate to the light-shielding pattern; and dry-etching the transparent film of uniform thickness using the photoresist pattern or the photoresist pattern plus the ionizing radiation resist pattern as a mask to form a phase shifter pattern.

* * * * *